(12) United States Patent
Lee et al.

(10) Patent No.: US 9,432,044 B1
(45) Date of Patent: Aug. 30, 2016

(54) MISMATCH CORRECTION OF ATTENUATION CAPACITOR IN A SUCCESSIVE APPROXIMATION REGISTER ANALOG TO DIGITAL CONVERTER

(71) Applicant: Texas Instruments Incorporated, Dallas, TX (US)

(72) Inventors: Seung Bae Lee, Allen, TX (US); Ajit Sharma, Dallas, TX (US); Srinath Ramaswamy, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/973,902

(22) Filed: Dec. 18, 2015

(51) Int. Cl.
  *H03M 1/10* (2006.01)
  *H03M 1/38* (2006.01)
  *H03M 1/06* (2006.01)

(52) U.S. Cl.
  CPC ............ *H03M 1/38* (2013.01); *H03M 1/0617* (2013.01); *H03M 1/1023* (2013.01)

(58) Field of Classification Search
  CPC ...... H03M 1/468; H03M 1/804; H03M 1/68; H03M 1/0682; H03M 1/466; H03M 1/1038; H03M 1/1061; H03M 1/462; H03M 1/1071; H03M 1/069; H03M 1/1009; H03M 1/1057; H03M 1/00; H03M 1/403; H03M 1/0607
  USPC .................. 341/118, 120, 155, 172
  See application file for complete search history.

(56) References Cited

U.S. PATENT DOCUMENTS

| | | | |
|---|---|---|---|
| 7,170,439 B1* | 1/2007 | Chen .................. | H03M 1/1009 341/118 |
| 2010/0079327 A1* | 4/2010 | Berens ................ | H03M 1/0682 341/158 |
| 2013/0044015 A1* | 2/2013 | Reinhold ............ | H03M 1/1061 341/110 |
| 2013/0088375 A1* | 4/2013 | Wu ...................... | H03M 1/1047 341/120 |
| 2014/0167988 A1* | 6/2014 | Hong .................. | H03M 1/1061 341/110 |
| 2014/0184432 A1* | 7/2014 | Huang ................ | H03M 1/1057 341/110 |
| 2015/0263744 A1 | 9/2015 | Sharma et al. | |

OTHER PUBLICATIONS

"Successive approximation ADC", Wikipedia, available at https://en.wikipedia.org/wiki/Successive_approximation_ADC on Nov. 21, 2015, pp. 1-4.
Hae-Seung Lee et al, "A Self-Calibrating 15 Bit CMOS A/D Converter", Special Papers, IEEE Journal of Solid-State Circuits, vol. SC-19, No. 6, Dec. 1984, pp. 813-819.
Masato Yoshioka et al, "A 10-b 50-MS/s 820-W SAR ADC With On-Chip Digital Calibration", IEEE Transactions on Biemedical Circuits and Systems, vol. 4, No. 6, Dec. 2010, pp. 410-416.
Ajit Sharma et al, "Calibrated SAR ADC Having a Reduced Size", U.S. Appl. No. 14/782,676, filed Jun. 5, 2015, pp. 1-57.

\* cited by examiner

*Primary Examiner* — Linh Nguyen
(74) *Attorney, Agent, or Firm* — John R. Pessetto; Frank D. Cimino

(57) ABSTRACT

A multi-segment capacitive successive approximation analog to digital converter (SAR ADC) is calibrated by determining an error voltage for each of a plurality of most significant bit (MSB) capacitors in a first segment using a calibration DAC. The first segment is connected to the second segment by an attenuation capacitor. Each of the error voltages corresponding to the MSB capacitors is digitized to form a set of digitized error voltages. An error voltage for each of a plurality of less significant bit (LSB) capacitors in at least the second segment is calculated by summing the set of digitized error voltages to form a sum of error voltages (sum(e)) and assigning a percentage of sum(e) as the error voltage for each of the LSB capacitors, such that a mismatch in the attenuation capacitor is mitigated.

10 Claims, 9 Drawing Sheets

MISMATCH CORRECTION OF ATTENUATION CAPACITOR IN A SUCCESSIVE APPROXIMATION REGISTER ANALOG TO DIGITAL CONVERTER

FIELD OF THE INVENTION

The present invention relates to a successive approximation register (SAR) analog-to-digital converter (ADC) and, more particularly, to a calibrated SAR ADC that has multiple segments connected by attenuation capacitors.

BACKGROUND OF THE INVENTION

Current-generation integrated circuits often include both analog and digital circuits. An analog-to-digital converter (ADC) is an electronic circuit that converts an analog signal into a digital word that represents the analog signal so that the analog signal can be processed by a digital circuit. One well-known type of ADC is a successive approximation register (SAR) ADC.

A SAR ADC includes a digital-to-analog converter (DAC), which is commonly implemented with a series of capacitors and a number of switches. The capacitors have top plates that are connected together, and bottom plates that are individually connectable by way of the switches to an input voltage, a reference voltage, and ground.

The capacitors include a number of binary-valued capacitors, such as 1C, 2C, 4C, 8C, and 16C, where 1C represents the capacitance and plate area of the smallest capacitor that can be fabricated with a given process. A 16C capacitor has 16× the capacitance and plate area of the 1C capacitor, while an 8C capacitor has 8× the capacitance and plate area of the 1C capacitor.

The binary-valued capacitors include a 1C dummy capacitor that allows the capacitor values to be evenly divided. For example, the first four binary-valued capacitors (1C, 2C, 4C, 8C) in combination with the 1C dummy capacitor have a total capacitance of 16C, which is equal to the fifth binary-valued capacitor (16C). Similarly, the first three binary-valued capacitors (1C, 2C, 4C) in combination with the 1C dummy capacitor have a total capacitance of 8C, which is equal to the fourth binary-valued capacitor (8C).

Each of the binary-valued capacitors, with the exception of the dummy capacitor, corresponds to a bit in the digital word output by the SAR ADC. For example, a SAR ADC that outputs a five-bit word typically has six binary-valued capacitors, five bit capacitors and one dummy capacitor.

The largest binary-valued capacitor (16C in the present example) represents the most significant bit (MSB), while the smallest binary-valued capacitor (1C in the present example) represents the least significant bit (LSB). In addition to the capacitive-based DAC, a SAR ADC also includes a comparator and a controller.

In operation, the capacitive-based DAC receives a sequence of control words from the controller, which controls the positions of the switches which, in turn, determine whether the input voltage, the reference voltage, or ground is connected to the binary-weighted capacitors.

The sequence of connecting and reconnecting the voltages generates a sequence of DAC voltages at the input of the comparator, which compares the sequence of DAC voltages to ground, and outputs a sequence of logic values that represents the results of the comparisons. The controller interprets the sequence of logic values, and sequentially assigns a logic state to each bit position in the digital word that represents the input voltage.

A high-resolution SAR ADC can be formed by increasing the number of bits within the digital word that represents the input voltage. For example, a SAR ADC that outputs a 10-bit word has a much higher resolution than a SAR ADC that outputs a 5-bit word. However, as the number of bits increase, the size of the largest binary-valued capacitor significantly increases. The largest capacitor in a 5-bit word is 16× larger than the smallest capacitor, whereas the largest capacitor in a 10-bit word is 1024× larger.

One approach to reducing the size of a high-resolution SAR ADC is to use a segmented capacitor-based DAC. In the smallest segmented capacitor-based DAC, a first group of capacitors and switches are used to form a main DAC, while a second group of capacitors and switches are used to form a sub DAC that is connected to the main DAC by an attenuating capacitor.

For example, the main DAC can include a number of binary-valued capacitors, such as 1C, 2C, 4C, 8C, and 16C, while the sub DAC can include a number of binary-valued capacitors, such as 1C, 2C, and 4C. The attenuating capacitor reduces the effect of the capacitors in the sub DAC so that the 4C capacitor in the sub DAC has the effect of a 1/2C capacitor, the 2C capacitor in the sub DAC has the effect of the 1/4C capacitor, and the 1C capacitor in the sub DAC has the effect of the 1/8C capacitor. Thus, in the present example, an 8-bit DAC formed with a main DAC and a sub DAC can be formed in a much smaller area than an 8-bit DAC that is formed with 1C, 2C, 4C, 8C, 16C, 32C, 64C, and 128C.

BRIEF DESCRIPTION OF THE DRAWINGS

Particular embodiments in accordance with the invention will now be described, by way of example only, and with reference to the accompanying drawings.

Figure 1:
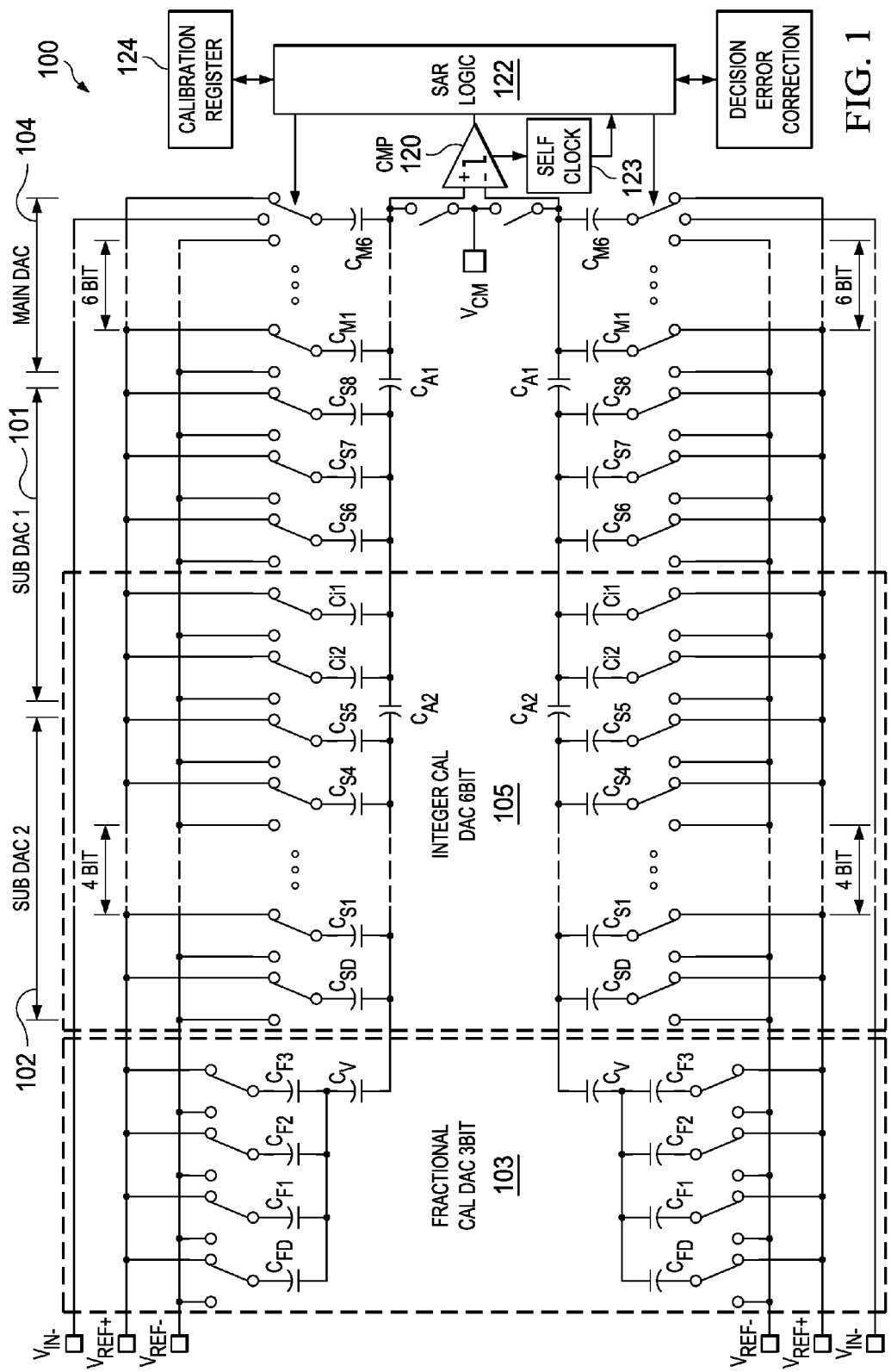
FIG. 1 is a block diagram of an exemplary differential ADC with a merged calibration DAC that includes an embodiment of the present disclosure.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Sensor signal conditioners typically require analog-to-digital converters (ADCs) with resolution beyond 12 bits and typically need to sense multiple physical signals. Successive approximation register (SAR) ADCs are attractive due to their low power consumption and for ease of multiplexing. Moreover, no high performance operational amplifiers are required in the SAR ADCs, which makes them attractive in sub-micron scaled CMOS processes.

However, capacitor mismatch has been one of the primary bottle necks for high resolution (>12b) SAR ADCs. To overcome the capacitor mismatch limitation, self-calibration using a resistive calibration digital-to-analog converter (cal. DAC) was introduced; see e.g. H.-S. Lee, D. A. Hodges, and P. R. Gray, "A self-calibrating 15 bit CMOS A/D converter," IEEE J. Solid-State Circuits, vol. 19, no. 6, pp. 813-819, December 1984 (referred to herein as "Lee"), which is incorporated by reference herein. Although the ADC in Lee exhibits high-resolution performance thanks to the calibration method, low power operation was difficult to achieve because the resistive cal. DAC consumes static power. Later, a capacitive cal. DAC was used to reduce the power consumption; see e.g. M. Yoshioka, K. Ishikawa, T. Takayama, and S. Tsukamoto, "A 10-b 50-MS/s 820-µW SAR ADC with on-chip digital calibration," Proc. IEEE Int. Solid-State Circuits Conf., February 2010, pp. 384-385 (referred to herein as "Yoshioka"), which is incorporated by reference herein. The separate capacitive cal. DAC of Yoshioka has the disadvantage of large size compared with a resistive cal. DAC. Related U.S. patent application Ser. No. 14/732,676, filed Jun. 6, 2015, Ajit Sharma et al, entitled "Calibrated SAR ADC Having a Reduced Size" (referred to herein as "Sharma") which is incorporated by reference herein, presents an improved calibration method that uses the sub DACs of the SAR DAC array as the cal. DAC to achieve both low power operation and small physical size. Sharma discloses a procedure for calibrating the capacitors of a main DAC that produces the most significant bits (MSB) of the digitized output using a calibration DAC formed by sharing a set of capacitors that are part of one or more sub DACs that produce the least significant bits (LSB) of the digitized output and thereby eliminate the need for a separate calibration DAC.

Further improvements are disclosed herein to enable calibration of the capacitors in the one or more sub DACs and the attenuation capacitor(s) that connect the segments of the SAR ADC, as will be described in more detail below.

FIG. 1 is a block diagram of an exemplary differential ADC 100 with a merged calibration DAC (cal. DAC) that includes an embodiment of the present disclosure. As mentioned above, a SAR ADC includes a digital-to-analog converter which is commonly implemented with a series of capacitors and a number of switches. The capacitors have top plates that are connected together, and bottom plates that are individually connectable by way of the switches to an input voltage, a reference voltage, and ground. In this example, the DAC array includes a main DAC 104, a first sub DAC 1 101 and a second sub DAC 2 102, and a fractional cal. DAC 103. Capacitor CM6 is the most significant bit (MSB) capacitor in the main DAC, and, CS8 and CS4 are the MSB caps in the sub DAC 1 and 2, respectively. CFD and 0 are dummy capacitors to compensate gain error of the ADC, which have the same size as CF1 and Cs1, respectively. and Ci1 and Ci2 are for capacitor mismatch calibration. The ideal capacitances of those caps are given by expression (1).

Capacitor mismatch is directly related to the ADC linearity performance. A smaller capacitor has worse mismatch performance by Pelgrom's law, but a larger capacitor will consume larger dynamic power and take more area. Dividing the DAC array into segments connected together by attenuation capacitors 106, 107 and 108 allows the size of the MSB capacitors to be reduced, as described above in more detail.

Figure 2:
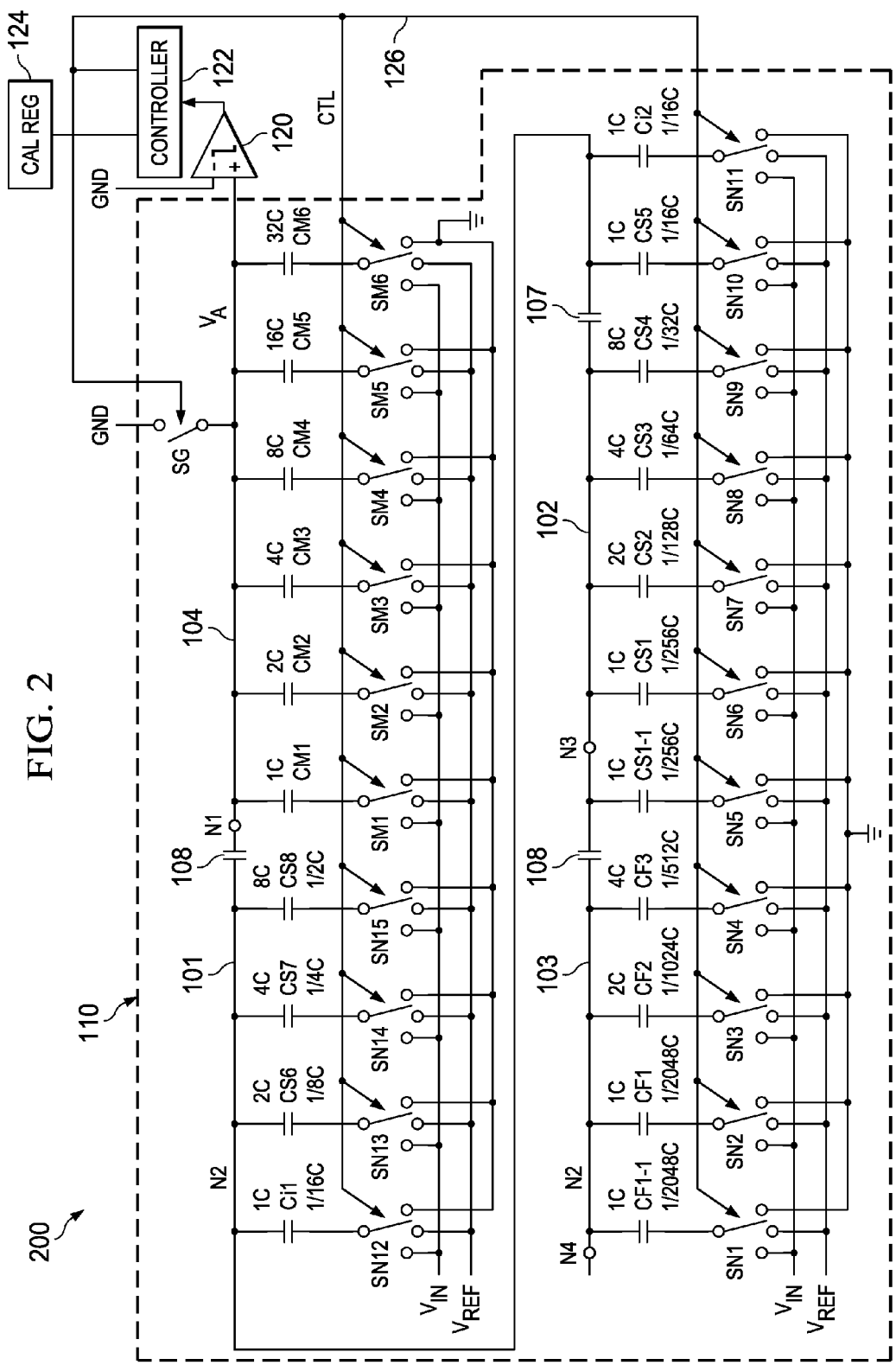
FIG. 2 is a more detailed circuit diagram of just one side of the ADC of FIG. 1.

FIG. 2 is a more detailed circuit diagram 200 of just one side of the ADC of FIG. 1. The other side is similar but is not shown for clarity. As shown in FIG. 1, SAR ADC 100 includes a digital-to-analog converter (DAC) 110 that is connected to receive an input voltage VIN, a reference voltage VREF, and ground. In addition, DAC 110 is connected to receive a sequence of control words CTL on control bus 120 that direct each switch SM1-SM6 and SN1-SN15 to select between the input voltage VIN, the reference voltage VREF, and ground. Further, DAC 110 generates a sequence of DAC voltages VA, where the DAC voltages VA vary over time in response to changes in the voltages VIN, VREF, and ground, which are selected by the sequence of control words CTL.

DAC 110 includes a segmented capacitor array that has four segments 101-104 connected in series. Attenuation capacitors 106-108 are connected between the segments such that an attenuation capacitor is connected to and between each adjacent pair of segments. Segment 104 includes a main DAC segment with a main node N1. Segments 101, 102 include sub-DACs with subnodes N2, N3. Segment 103 includes a fractional DAC with subnode N4. While a main DAC and two sub-DACs are illustrated in this example, other embodiments may have more or fewer segments and resultant sub-DACs.

DAC 110 also includes a ground switch SG that is connected to and between DAC segment 103 and ground.

Main DAC segment 104 has a number of binary-weighted main conversion capacitors CM1-CM6. In addition, main DAC segment 104 has a number of main switches SM1-SM6 that are connected to the main conversion capacitors CM1-CM6. While six main conversion capacitors and associated switches are implemented in this example, other embodiments may have more or fewer conversion capacitors in the main DAC segment, as indicated by referring to main conversion capacitors "CM1-CMm" herein.

Each of the main conversion capacitors CM has a first plate that is connected to the main node N1, and a second plate that is connected to a main switch SM. Each main switch SM, in turn, can be connected to receive the input voltage VIN, the reference voltage VREF, or ground. Each main switch SM is also connected to receive the sequence of control words CTL, which selects the voltage VIN, VREF, or ground that is to be placed on the second plates of the main conversion capacitors CM.

The binary-weighted main conversion capacitors CM include six capacitors CM1-CM6, which have the following weights: CM6-32C, CM5-16C, CM4-8C, CM3-4C, CM2-2C, and CM1-1C, where 1C represents the capacitance and plate area of the smallest capacitor that can be fabricated with a given process.

Sub-DAC segment 101 has a number of binary-weighted sub-DAC capacitors CS5-CS8. Additionally, sub-DAC 101 includes capacitors Ci1, Ci2 that have substantially identical weights as capacitor CS5. These capacitors are also referred to as $C_{CM}$ and $C_{CO}$. Sub-DAC segment 102 has a number of binary-weighted sub-DAC capacitors CS1-CS4. Additionally, sub-DAC 102 includes capacitor CS1-1 (also referred to as $C_{SD}$) that has substantially identical weight as capacitor $$CCM = CCO = CS6. \qquad (1)$$

CS1. Fractional sub-DAC segment 104 has a number of binary-weighted sub-DAC capacitors CF1-CF3. Additionally, sub-DAC 103 includes capacitor CF1-1 ($C_{FD}$) that has substantially identical weight as capacitor CR.

In addition, the sub-DAC segments 101, 102, 103 have a number of switches SN1-SN15 that are connected to the sub-DAC capacitors.

Each of the sub-DAC capacitors has a first plate that is connected to a sub-node N2-N4, and a second plate that is connected to a switch SN. Each switch SN, in turn, can be connected to receive the input voltage VIN, the reference voltage VREF, or ground. Each switch SN is also connected to receive the sequence of control words CTL from control bus 120, which selects the voltage VIN, VREF, or ground that is to be placed on the second plates of the sub-DAC capacitors CN.

In the FIG. 2 example, the binary-weighted sub-DAC capacitors include eight capacitors which have the following weights: CS8-8C, CS7-4C, CS6-4C, CS5-1C, CS4-8C, CS3-4C, CS2-2C, CS1-1C. CS1-1, Ci1, and Ci2 also have a weight of 1C. However, as described above, the effect of the attenuation capacitors 106, 107 is that the fourteen conversion capacitors range from 1C/256 to 32C in a binary weighted progression, which, in turn, allows smaller capacitor arrays to be used to implement a series of binary-weighted capacitors.

The sub-DAC capacitors include sub-conversion capacitors Ci1, Ci2, and a number of fractional calibration capacitors CF1-CF3.

SAR ADC 200 also includes a comparator 120 and a controller 122. Comparator 120 has a first input connected to the main node N1, a second input connected to a control voltage, such as ground, and an output. Comparator 120 compares the voltages on the first and second inputs, and generates a sequence of logic values that depend on the results of the comparisons.

Controller 122, which controls the operation of SAR ADC 200, is connected to control ground switch SG, the main switches SM1-SMm, the switches SN1-SNn, and comparator 120. In addition, controller 122 determines the logic states of the bits within a digital word DIG that represents a sampled portion of the input voltage VIN in response to the sequence of logic values generated by comparator 120, and outputs the digital word DIG. Controller 122 may be implemented as a state machine, or micro controller, for example. Controller 122 may operate in a synchronous manner in response to clock logic 123. A set of registers or memory 124 may be used to store the results of a self-calibration procedure that will be explained in more detail below.

SAR ADC 100, 200 has two modes of operation: a calibration mode and a normal mode. The calibration mode performs a calibration process that is used to compensate for variations between the values specified for the main conversion capacitors CM1-CMm and the actual values of the main conversion capacitors CM1-CMm.

When in the calibration mode, controller 122 executes a calibration binary search algorithm that generates a sequence of control words CTL. The sequence of control words CTL connect the main conversion capacitors CM1-CMm, the sub-conversion capacitors CS1-CS8, Ci1, Ci2, CS1-1, and the fractional calibration capacitors FC1-FC3 via the switches SM and SN to either the reference voltage VREF or ground, which generates a sequence of DAC voltages VA.

Comparator 120 compares the sequence of DAC voltages VA to a control voltage, such as ground, and outputs a sequence of logic values that represent the results of the comparisons. Controller 122 interprets the sequence of logic values, and determines the calibration conditions for the main conversion capacitor CM that is being calibrated. Controller 122 includes a memory 124 that stores the calibration conditions.

The normal mode determines the digital word DIG, which represents a digitized representation of the input voltage VIN. When in the normal mode of operation, controller 122 executes an ADC binary conversion algorithm that generates a sequence of control words, which are modified by the calibration conditions, to output the sequence of control words CTL.

The sequence of control words CTL connect the main conversion capacitors CM1-CMm, the sub-conversion capacitors CS1-C58, Ci1, Ci2, CS1-1, and the fractional calibration capacitors FC1-FC3 via the switches SM and SN to either the reference voltage VREF or ground, which generates the sequence of DAC voltages VA.

Comparator 120 compares the DAC voltage VA to a control voltage, such as ground, and outputs a sequence of logic values that represent the results of the comparisons. Controller 122 interprets the sequence of logic values, and sequentially assigns a logic value to each bit in the digital word DIG. Controller 122 includes a memory 124 that stores the digital word DIG.

The binary-weighted main conversion capacitors CM1-CM6 correspond to the most significant bits in the digital word DIG output by SAR ADC 100, 200, with CM6 representing the most significant bit MSB of the digital word DIG, CM5 representing MSB-1 of the digital word DIG, and CM1 representing MSB-5 of the digital word DIG.

The binary-weighted shared capacitors CS1-C58 provide the remaining eight LSBs of the 14-bit digital word DIG. The shared capacitors Ci1 Ci2 are used to apply calibration conditions to the main conversion capacitors CM1-CMm.

In operation, SAR ADC 100 first calibrates the MSB capacitor CM6 to determine the calibration conditions for the MSB capacitor CM6 (which compensates for differences between the specified value and the actual value of the MSB capacitor CM1). Once the calibration conditions for the MSB capacitor CM6 have been determined, SAR ADC calibrates the MSB-1 capacitor CM5 to determine the calibration conditions for the MSB-1 capacitor CM5 (which compensate for differences between the specified value and the actual value of the MSB-1 capacitor CM5). The process continues until the calibration conditions have been determined for all of the main conversion capacitors CM1-CMm.

Calibration of Main DAC

As mentioned above, the cal. DAC for the main DAC calibration includes a 6-bit integer cal. DAC 105 and 3-bit fractional cal. DAC 103 as shown in FIG. 1. The integer cal. DAC 105 is a part of the sub DAC 1 and 2 with additional caps, Ci1, Ci2. The merged calibration DAC architecture is possible because an explicit mismatch calibration is not necessary for the sub DAC 1 and 2; however, the sub DAC capacitors may be calibrated using a derived calibration process, as will be described in more detail below. Ci1 plays a role in the MSB of the cal. DAC, and Ci2 exists to prevent overflowing during the sub DAC conversion cycles.

Figure 3:
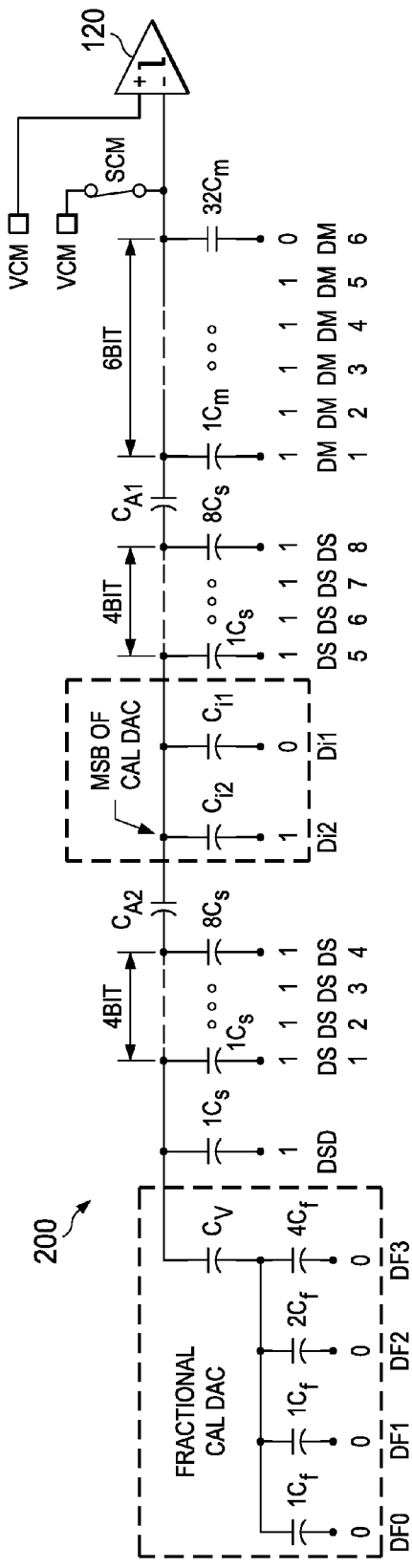
FIGS. 3-5 illustrate a calibration process for the most significant bit of the main DAC.
Figure 4:
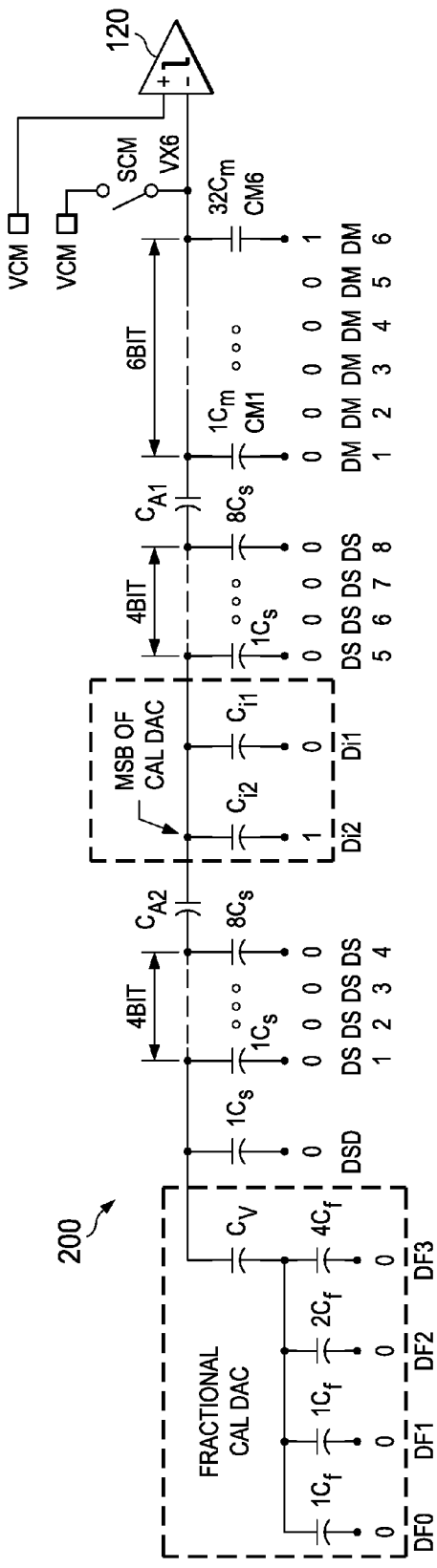
Figure 5:
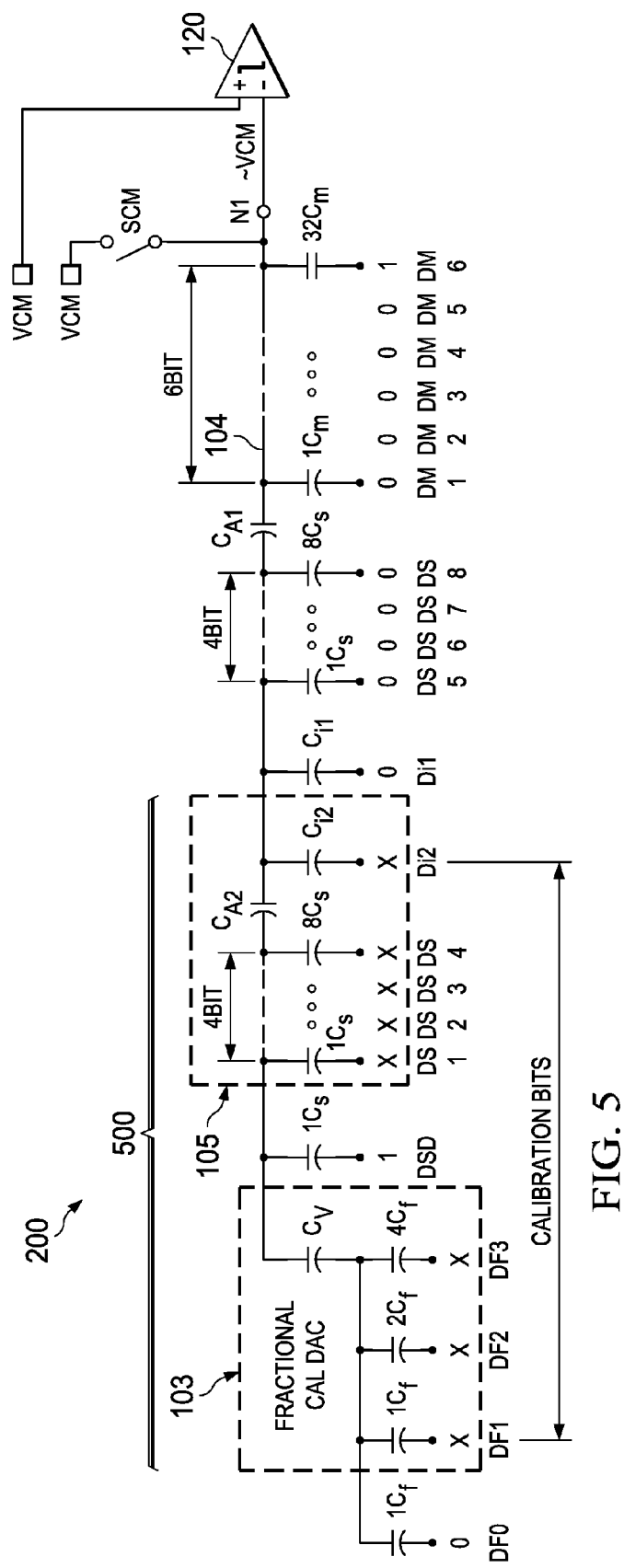

During a self-calibration period, the capacitors in the main DAC, CM6-CM1, are calibrated using an explicit calibration process. The digitized mismatch information is stored in the internal calibration register 124 shown in FIG. 1, which is used to compensate the capacitor mismatch errors during normal conversion cycles. The detailed procedure of the self-calibration for CM6 is shown in FIGS. 3-5. For the simplicity, only the single-ended DAC 200 is shown in FIGS. 3-5 although the fully differential DAC structure 100 operates in a similar manner. In FIG. 3, DX is a digital bit indicating the connection of the bottom plate of the corresponding CX. If DX is 1 or 0, CX is connected to VREF+ or VREF−, respectively by the switches Sn illustrated in FIG. 2. Three periods are necessary for each capacitor calibration: a reset period, a charge redistribution period, and an analog to digital (A2D) period with a SAR algorithm to determine an error voltage.

For example, for the MSB capacitor CM6, digital control bits DM6-DF1 are set as shown in FIG. 3 during the reset period. As mentioned above, controller 122 controls the operation and provides the digital control word CTL on bus 120, as shown in FIG. 2. After the reset period, SCM (common mode switch) (also referred to as SG) is released, and the switch connections are reversed, except DF1-DF3, Di2, and Di1, during the charge redistribution period illustrated in FIG. 4. As a result, voltage VX6 will represent an error voltage because of the mismatch between capacitor CM6 and the rest of the capacitors.

Error voltage VX6 may then be digitized into a digital representation DVX6 using a SAR algorithm and a calibration DAC 500 that includes integer calibration DAC 105 and fractional calibration DAC 103, as described with regard to FIG. 1. Calibration DAC 500 makes use of capacitors CS5-CS1, CF3-CF1, and Ci2 under control of controller 122 during the A2D period. Because Ci2 was initially set to 1, the calibration bits 500 can sense both positive and negative error voltages. During calibration, the capacitors forming cal DAC 500 in sequentially connected to Vref and Vref−, which in this example Vref− is ground, while a resulting VX6 voltage is compared to the common mode voltage (VCM) input of comparator 120 according to the successive approximation algorithm. In this example, VCM is the ground reference voltage, although in other embodiments a different VCM value may be used, such as Vref/2. The cal. DAC configuration after the A2D period is shown in FIG. 5. Here, the final main DAC voltage on segment 104 will be approximately equal to VCM within the cal. DAC resolution, and VX6 is digitized into DVX6 by according to expression (2).

$$DV_{xi} = [D_{i2}, D_{S5}, \ldots D_{F1}]_2 - 2^{NCAL-1} \quad (2)$$

where NCAL is a number of calibration bits, and $2^{NCAL-1}$ is an initially generated offset by Ci2. In this example, NCAL is 9.

The calibration process illustrated in FIGS. 3-5 may then be repeated iteratively for each of the main DAC capacitors CM1-CM5. The error voltage of each cap may be computed from DVXi as described in more detail in Lee, using expression (3).

$$DV_{ei} = \frac{1}{2}\left(DV_{xi} - \sum_{j=i+1}^{N_M} DV_{ej}\right) \quad (3)$$

Table 1 illustrates the result for all six main caps in the example of FIG. 2.

TABLE 1

Digitized calibration results for main DAC

DM6 = $DX_{M6}/2$
DM5 = $(DX_{M5} - D_{M6})/2$
DM4 = $(DX_{M4} - (D_{M6} + D_{M5}))/2$

TABLE 1-continued

Digitized calibration results for main DAC

DM3 = $(DX_{M3} - (D_{M6} + D_{M5} + D_{M4}))/2$
DM2 = $(DX_{M2} - (D_{M6} + D_{M5} + D_{M4} + D_{M3}))/2$
DM1 = $(DX_{M1} - (D_{M6} + D_{M5} + D_{M4} + D_{M3} + D_{M2}))/2$

The DVei digital value computed by expression (3) for each capacitor CM1-CM6 may be stored in the calibration resister 124, referring again to FIG. 1.

Calibration of the Sub DACs

Further research has now determined that conversion accuracy of ADC 100, 200 may be further improved by calibrating at least a portion of the capacitors that form sub DACs 101, 102. After the main DAC has been explicitly calibrated using the shared cal DAC as described above, the sub DACs may be implicitly calibrated by summing the set of digitized error voltages determined for the main DAC to form a sum as illustrated by expression (4) and assigning a percentage of the sum as the error voltage for each of the LSB capacitors as illustrated in Table 2. This also effectively calibrates a mismatch in the attenuation capacitors CA1, CA2 between each segment.

$$D\text{sum} = D_{M6} + D_{M5} + D_{M4} + D_{M3} + D_{M2} + D_{M1} \quad (4)$$

TABLE 2

Implicit calibration of sub DACs and Attenuation Caps $D_{S8}$ = −(Dsum)/2
$D_{S7}$ = −(Dsum)/4
$D_{S6}$ = −(Dsum)/8
$D_{S5}$ = −(Dsum)/16
$D_{S4}$ = −(Dsum)/32
$D_{S3}$ = −(Dsum)/64
$D_{S2}$ = −(Dsum)/128
$D_{S1}$ = −(Dsum)/256

Normal Conversion Operation

The stored DVei values may be used in normal conversion cycles to compensate the mismatch errors in the main DAC array as follows. During normal operation, whenever Di becomes '1', the corresponding calibration value, DVei, should be subtracted from cal DAC 500. The accumulated correction code is represented by expression (5).

$$D_{CAL} = 2^{NCAL-1} - \sum_{j=i+1}^{NM} D_j DV_{ei} \quad (5)$$

where $2^{NCAL}-1$ is an offset to set DCi2 to 1 at zero error.

During the main DAC conversion steps, DCAL may be assigned to the shared cal DAC capacitors DCi2 to DF1 as shown by expression (6) and illustrated in FIG. 5 at 506.

$$[D_{i2}, D_{S5}, \ldots D_{F1}]_2 = D_{CAL} \quad (6)$$

After the conversions of the main DAC are done, the same SAR process continues using the sub DAC capacitors. DCAL will continue to change by subtracting a value of DVei whenever a corresponding Di becomes "1". This conversion process continues through capacitor DS6.

Figure 6:
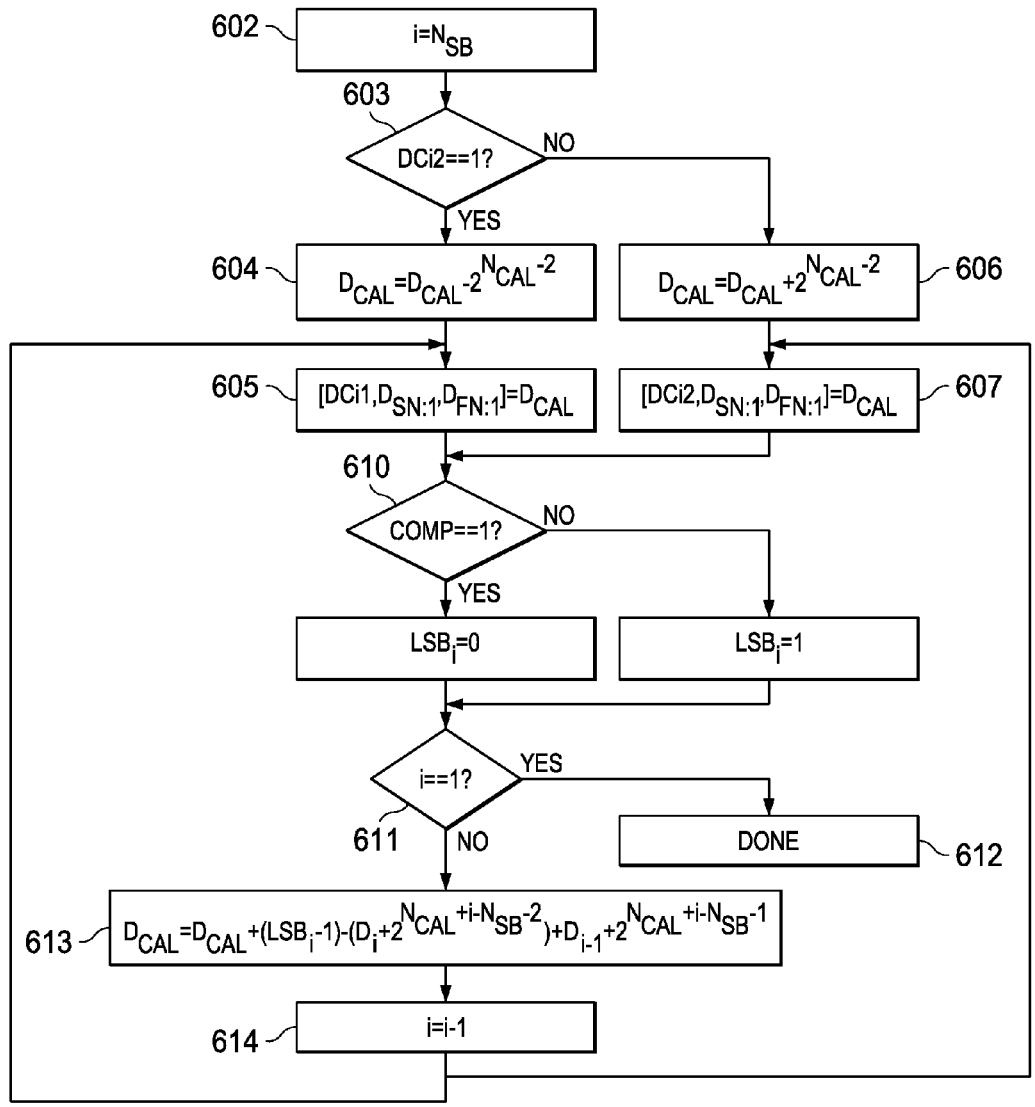
FIG. 6 is a flow chart illustrating updating of DCAL during a conversion process.

FIG. 6 is a flow chart illustrating updating of DCAL during a conversion process while using the shared capacitors. The conversion operation after DS6 will be overlapped with DCAL bits, since the cal DAC shares sub DAC conversion capacitors DS5-DS1. A special algorithm is used to address this issue. The basic idea is to compute the DCAL considering both the decision weight and the calibrated error bits, and compute the ADC outputs separately from DCAL. NSB (number of shared bits) 601 is the number of the ADC bits that are overlapped with DCAL, and NSB is 5 in the present example. The ADC outputs from the algorithm are $LSB_{NSB}$-$LSB_1$. Initially 603, if DCi2 is 1, it means DCAL is higher than 2^NCAL−1 and overflowing may happen. So, in this case, DCi2 will not change, instead DCi1 will change during the rest conversion cycles. The weight of DCi2 is 2^NCAL−1 and the conversion weight for $LSB_{NSB}$ is 2^NCAL−1, so DCAL may be expressed as expression (7), as illustrated at 604.

$$D_{CAL}=D_{CAL}-2^{NCAL-1}+2^{NCAL-2}$$

$$D_{CAL}=D_{CAL}-2^{NCAL-2} \qquad (7)$$

If DCi2 is 0, DCAL may be expressed according to expression (8) for $LSB_{NSB}$ decision, as illustrated at 606.

$$D_{CAL}=D_{CAL}+2^{NCAL-2} \qquad (8)$$

After DCAL is updated, $LSB_{NSB}$ is determined by the output 610 of comparator 120. For $LSB_{NSB}$−1, DCAL is updated 613 again considering $LSB_{NSB}$ and the weight of $LSB_{NSB}$−1 In 613, Di means the mismatch error of the specific cap. According to equation (3), $D_i$ means $DV_{ei}$. According to Table 2, D1=DS1, D2=DS2, and so on.

A similar procedure will continue 611 until LSB1 is determined. After the conversion, LSB5 to LSB1 will be the ADC outputs with DM6 to DS6 in the present example.

Figure 7:
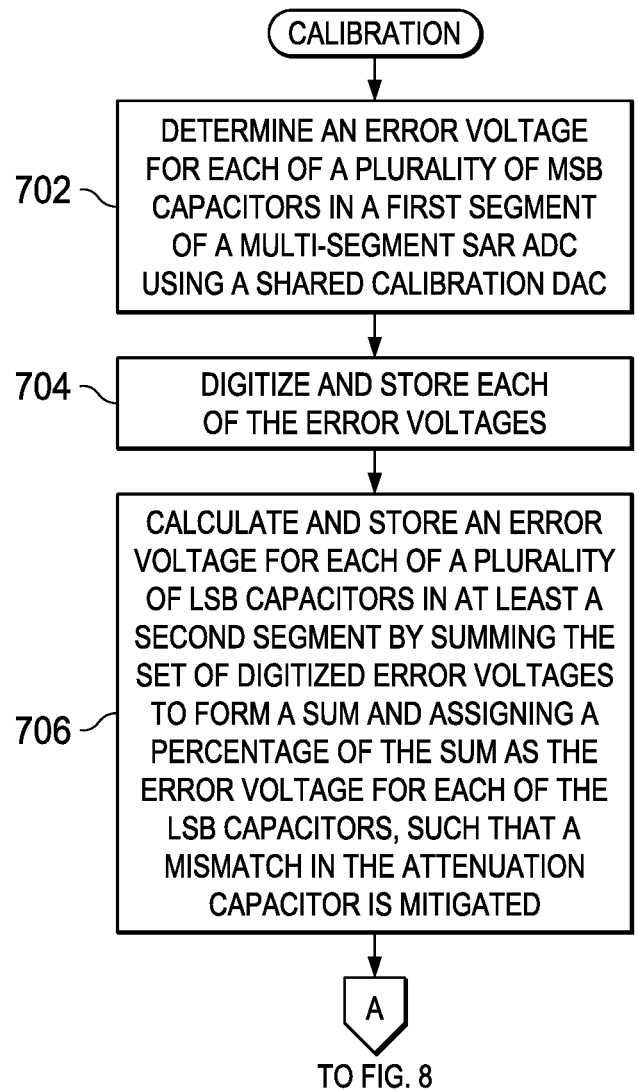
FIGS. 7 and 8 are flow charts illustrating the overall SAR ADC process.

FIG. 7 is a flow chart illustrating the calibration process for a multi-segment SAR ADC using a shared calibration DAC, as described above in more detail. Referring back to FIGS. 1 and 2, a multi-segment SAR ADC may have main DAC 104 in a first segment, and one or more sub DACs 101, 102 in other segments. An attenuation capacitor 106, 107 connects each adjacent segment.

An error voltage is determined 702 for each of a plurality of most significant bit (MSB) capacitors in the first segment of the multi-segment SAR ADC using a calibration DAC formed by a plurality of less significant bit capacitors in at least a second segment of the multi-segment SAR ADC. The first segment is connected to the second segment by an attenuation capacitor. Each of the error voltages corresponding to the MSB capacitors is digitized and stored 704 to form a set of digitized error voltages. Each error voltage may be digitized by using a calibration DAC that is formed by sharing a set of capacitors in one or more of the sub DAC segments.

A logic module, such as logic module 122, controls the sequence of operations, as described above in more detail. The digitized error voltages may be stored in a register set or a memory circuit connected to the logic module, such as memory circuit 124, referring back to FIG. 1. A three step process may be used to determine an error voltage for each capacitor in which a reset is performed, a charge distribution is performed, and an analog to digital step is performed using a successive approximation technique using the calibration DAC, as described above in more detail.

An error voltage is calculated and stored for each of a plurality of less significant bit (LSB) capacitors in at least the second segment by summing the set of digitized error voltages to form a sum and assigning a percentage of the sum as the error voltage for each of the LSB capacitors, such that a mismatch in the attenuation capacitor is accommodated. The process of summing and allocating percentages may be performed by the control logic module 122, for example.

Typically, a calibration process as described in FIG. 7 may be performed once when the SAR ADC is powered on, for example. The results may be stored and used during normal conversion operation. Alternatively, calibration may be performed during final testing after manufacture, for example, and the results stored in a non-volatile memory circuit for use during normal conversion operation.

Figure 8:
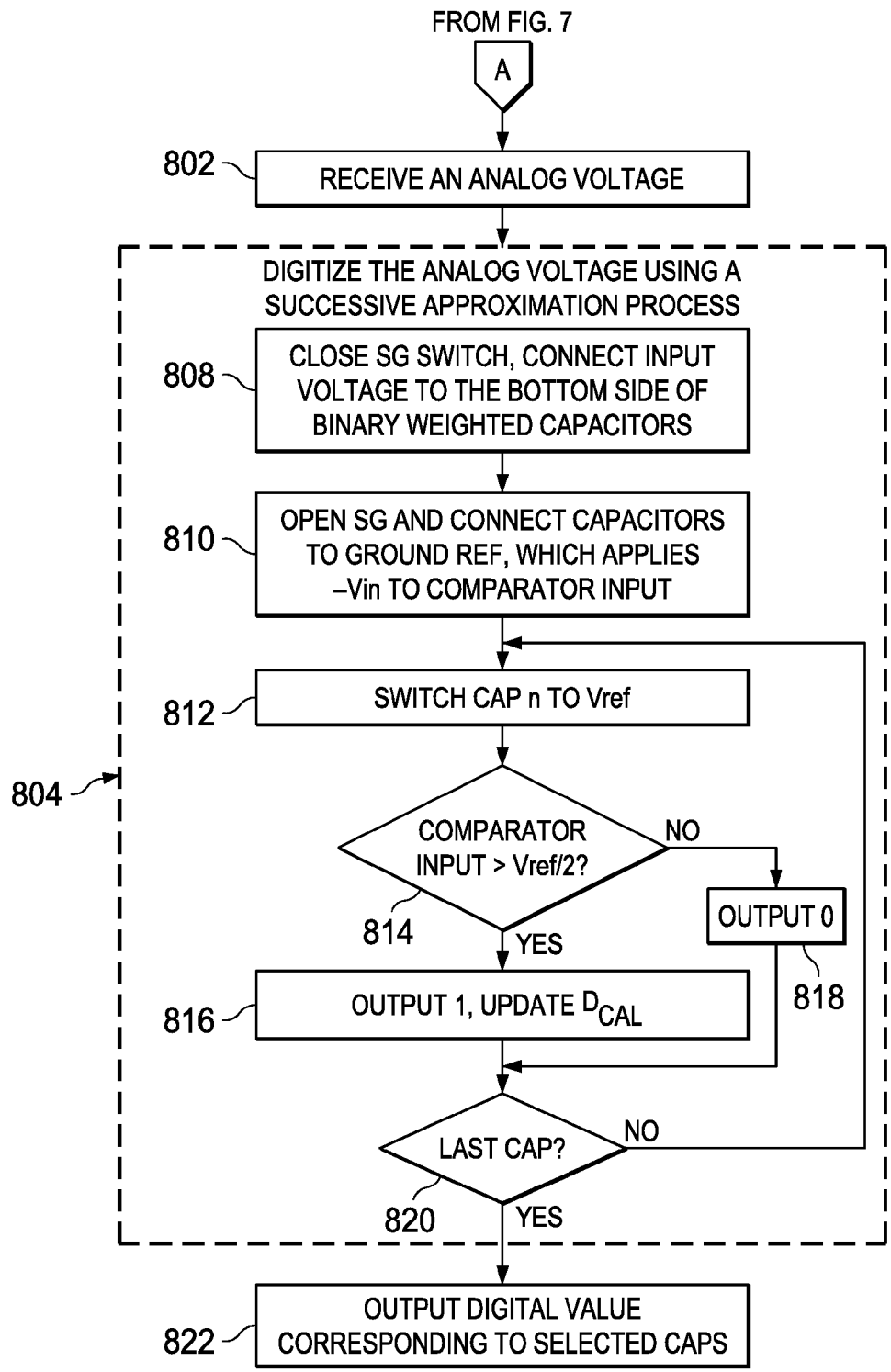

FIG. 8 is a flow chart illustrating a conversion process performed by the SAR ADC 100/200 of FIGS. 1-6, for example. SAR ADC 100/200 operates as a charge-redistribution successive approximation ADC. The general operating procedure will be described briefly herein; a more detailed description is provided in Sharma.

As described in more detail above, ADC 100/200 has of an array of individually switched binary-weighted capacitors. The amount of charge upon each capacitor in the array is used to perform the binary search in conjunction with comparator 120 and the successive approximation register 124.

An analog voltage Vin is received 802 on an input of the SAR ADC. The analog input voltage is digitized using a successive approximation technique 804.

During the SAR conversion process, switch SG is initially closed to apply a ground (FIG. 2) or a common mode reference voltage (FIG. 1) to the node N1, which is also the input to comparator 120. In FIG. 1, the common mode reference voltage is typically VREF/2. Simultaneously, the bottom plates of all of the binary weighted capacitors within the array are switched 808 to the input signal Vin using the set of switches SMn and SNn. The capacitors now have a charge equal to their respective capacitance times the input voltage minus the ground or common mode reference voltage upon each of them.

Switch SG is then opened and the capacitors are then switched 810 so that this charge is applied to the input of comparator 120 via node N1 by connecting the switches SMn and SNn to ground, creating a comparator input voltage equal to −Vin.

The actual conversion process then proceeds. First, the MSB capacitor is switched 812 to VREF, which corresponds to the full-scale range of the ADC. Due to the binary-weighting of the array, the MSB capacitor forms a 1:1 charge divider with the rest of the array. Thus, the input voltage to the comparator is now −Vin plus VREF/2. Subsequently, if Vin is greater 814 than VREF/2 then the control logic outputs 816 a digital 1 as the MSB, otherwise the control logic outputs 818 a digital 0 as the MSB. This process iterates 820 through all of the capacitors and each capacitor is tested in the same manner until the comparator input voltage converges to the offset voltage, or at least as close as possible given the resolution of the DAC.

On each iteration, when the bit output is a 1, then the Dcal value is updated 816 with the DVei corresponding to the selected capacitor according to expression (5) and provided to the cal DAC. When the output bit is 0, then Dcal is not changed.

After all of the capacitors have been tested, a final digital value is provided 822 by the control logic that corresponds to the individual bits determined above.

Figure 9A:
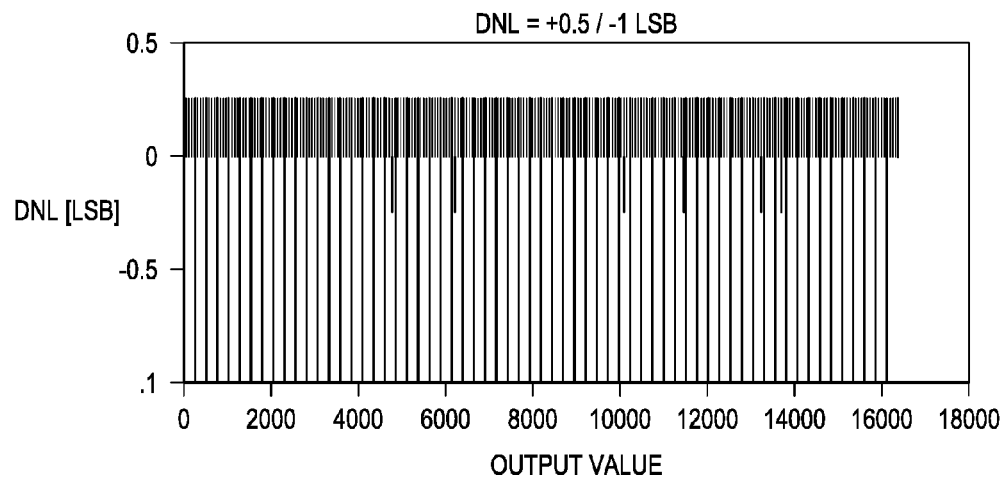
FIGS. 9A-9D are plots illustrating a comparison of non-linearity with and without LSB calibration.
Figure 9B:
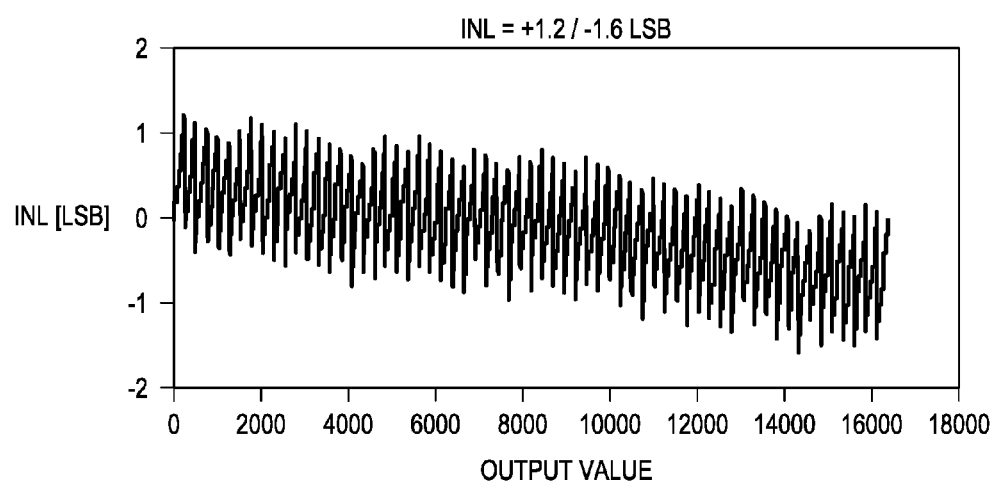
Figure 9C:
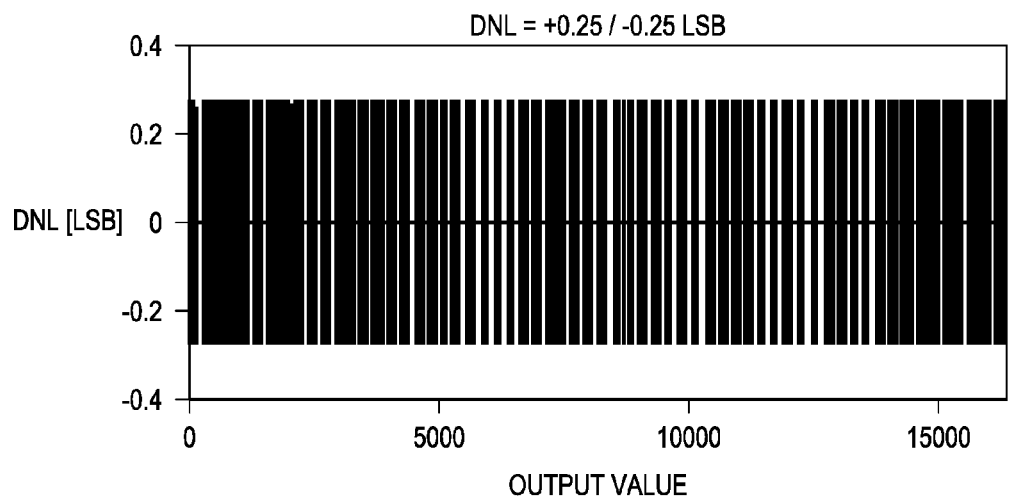

FIGS. 9A-9D are plots illustrating a comparison of non-linearity with and without LSB calibration. These plots are representative of a fourteen bit SAR ADC as described herein. FIG. 9A is a plot of differential non-linearity (DNL) with calibration of the main DAC, but no calibration of the sub DACs. FIG. 9C is a plot illustrating DNL when both the main DAC and sub DACs are calibrated as described herein. Note that the DNL drops from +0.5/−1 LSB for the non-calibrated sub DACs to only +0.25/−0.25 LSB when the sub DACs are calibrated.

Figure 9D:
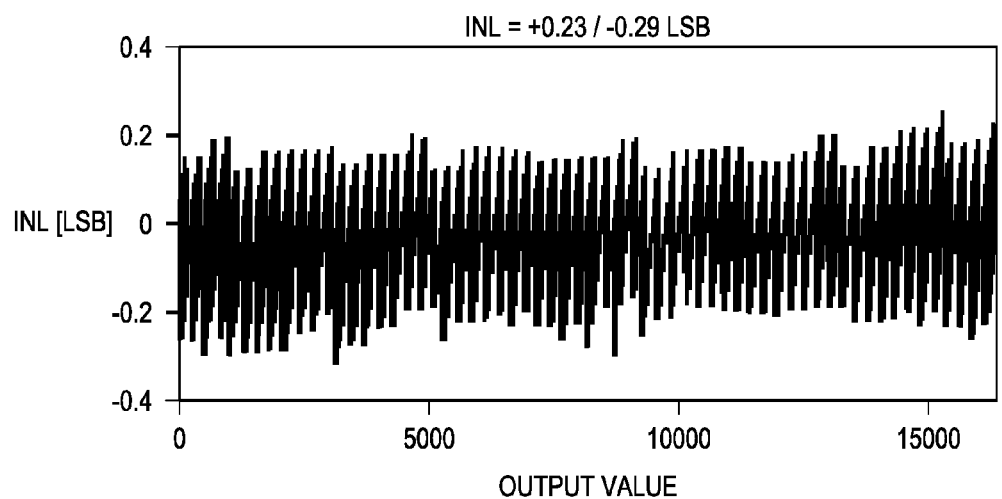

Similarly, the integer non-linearity drops from +1.2. −1.6 LSB when the sub DACs are not calibrated, as shown in FIG. 9C to only +0.23/−0.29 LSB when the sub DACs are calibrated, as shown in FIG. 9D.

System Example

A SAR ADC as described herein may be fabricated on an integrated chip using known or later developed semiconductor processing techniques. For example, a prototype ADC was fabricated using a 130-nm CMOS process with TaN-Poly parallel plate precision capacitors (29 masks). A total active area of the ADC is 700×520 µm2. A unit cap of 27.2 fF was used for the sub DACs and the fractional cal. DAC, and 81.6 fF of unit cap (3 units of 27.2 fF in parallel) for the main DAC to meet KT/C noise requirements. VREF+ and VREF− were selected as 1V & 0V (QGND) respectively. The calibration range is +/−32 LSB of mismatch with 1/8 LSB of calibration resolution.

The ADC has a low power mode (LP) and a high power (HP) mode by changing the power consumption of the preamplifiers in the comparator. It consumes a total of 1.3 µW at LP mode and 1.9 µW at HP mode from 1.5V analog & 1.1V digital supplies.

One or more such ADC may be combined on a system on a chip (SOC) along with one or more processors, memory circuits and other peripheral circuits to create a low power sensor device with high accuracy, for example.

OTHER EMBODIMENTS

While the invention has been described with reference to illustrative embodiments, this description is not intended to be construed in a limiting sense. Various other embodiments of the invention will be apparent to persons skilled in the art upon reference to this description. For example, while a fourteen bit ADC was described herein, the architecture described herein may be readily extended to more or fewer bits of resolution. An ADC as described herein may be implemented as either a differential device, such as ADC 100, or a single ended device such as ADC 200.

While calibration of the sub DACs has been described in the context of an ADC that has a shared cal DAC, another embodiment may include an ADC in which a separate cal DAC is provided. In that case, the adjustments described with regard to FIG. 6 are not needed. DCAL is simply applied to the separate cal DAC and does not need to be updated while the sub DAC capacitors are being evaluated.

In another embodiment, a SAR ADC may include a main DAC that has more or few than six bits, as described herein.

In another embodiment, a SAR ADC may include more than two sub DACs, as described herein, or only a single sub DAC, for example.

The techniques described in this disclosure may be implemented in hardware, software, firmware, or any combination thereof. If implemented in software, the software may be executed in control logic 122 by one or more processors, such as a microcontroller, an application specific logic function, a field programmable gate array (FPGA), a state machine, etc. The software that executes the techniques may be initially stored in a computer-readable medium such as compact disc (CD), a diskette, a tape, a file, memory, or any other computer readable storage device and loaded and executed in the processor. In some cases, the software may also be sold in a computer program product, which includes the computer-readable medium and packaging materials for the computer-readable medium. In some cases, the software instructions may be distributed via removable computer readable media (e.g., floppy disk, optical disk, flash memory, USB key), via a transmission path from computer readable media on another digital system, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A method for operating a multi-segment capacitive successive approximation analog to digital converter (SAR ADC), the method comprising:
   determining an error voltage for each of a plurality of most significant bit (MSB) capacitors in a first segment of the multi-segment SAR ADC using a calibration DAC, in which the first segment is connected to a second segment by an attenuation capacitor;
   digitizing and storing each of the error voltages corresponding to the MSB capacitors to form a set of digitized error voltages; and
   calculating and storing an error voltage for each of a plurality of less significant bit (LSB) capacitors in at least the second segment by summing the set of digitized error voltages to form a sum of error voltages (sum(e)) and assigning a percentage of the sum(e) as the error voltage for each of the LSB capacitors, such that a mismatch in the attenuation capacitor is also mitigated.

2. The method of claim 1, further including:
   receiving an analog voltage on an input of the SAR ADC;
   digitizing the analog voltage using successive approximation by:
     iteratively comparing a voltage formed by the analog voltage on each of the MSB capacitors and LSB capacitors to a reference voltage;
     for each iteration, selecting the capacitor if the voltage exceeds the reference voltage, otherwise ignoring the capacitor;
     for each iteration, calculating a running sum of the digitized error voltages corresponding to each selected MSB capacitor and LSB capacitor; and
     adjusting the selection of capacitors that form the calibration DAC to represent the running sum of error voltages.

3. The method of claim 2, further including forming a digital word in which bits are set to a first value in accordance with the selected MSB capacitors and LSB capacitors or to a second value in accordance with the non-selected MSB capacitors and LSB capacitors after completing the iterations.

4. The method of claim 2, in which the error voltages are assigned to the LSB capacitors in at least the second segment in a binary power progression, such that at least a first LSB capacitor is assigned 1/2 sum(e), a second LSB capacitor is assigned 1/4 sum(e), a third LSB capacitor is assigned 1/8 sum(e), and a fourth LSB capacitor is assigned 1/16 sum(e).

5. The method of claim 1, in which the calibration DAC is formed by a plurality of less significant bit capacitors in at least the second segment of the multi-segment SAR ADC.

6. A multi-segment capacitive successive approximation analog to digital converter (SAR ADC) comprising:
- a digital to analog converter (DAC) having a capacitor array, the capacitor array having a plurality of segments, and a number of attenuation capacitors that are connected to the plurality of segments such that an attenuation capacitor is connected to and between each adjacent pair of segments, the plurality of segments including:
  - a main DAC segment having a number of binary-weighted main conversion capacitors;
  - one or more sub-DAC segments having a number of binary-weighted sub-DAC capacitors;
- a comparator coupled to the DAC; and
- a controller coupled to a memory, and to the DAC and to the comparator, in which the controller is operable to:
- determine an error voltage for each of a plurality of most significant bit (MSB) capacitors in the main DAC segment of the multi-segment SAR ADC using a calibration DAC;
- digitize and store in the memory each of the error voltages corresponding to the MSB capacitors to form a set of digitized error voltages; and
- calculate and store in the memory an error voltage for each of a plurality of less significant bit (LSB) capacitors in at least the first sub DAC segment by summing the set of digitized error voltages to form a sum of error voltages (sum(e)) and assigning a percentage of the sum(e) as the error voltage for each of the LSB capacitors, such that a mismatch in the attenuation capacitor between the main DAC segment and the first sub DAC segment is mitigated.

7. The device of claim 6, in which the controller is further operable to:
- digitizing the analog voltage received on an input of the SAR DAC using successive approximation by:
  - iteratively comparing a voltage formed by the analog voltage on each of the MSB capacitors and LSB capacitors to a reference voltage;
  - for each iteration, selecting the capacitor if the voltage exceeds the reference voltage, otherwise ignoring the capacitor;
  - for each iteration, calculating a running sum of the digitized error voltages corresponding to each selected MSB capacitor and LSB capacitor; and
  - adjusting the selection of capacitors that form the calibration DAC to represent the running sum of error voltages.

8. The device of claim 7, in which the controller is further operable to form a digital word in which bits are set to a first value in accordance with the selected MSB capacitors and LSB capacitors or to a second value in accordance with the non-selected MSB capacitors and LSB capacitors after completing the iterations.

9. The device of claim 7, in which the error voltages are assigned to the LSB capacitors in at least the second segment in a binary power progression, such that at least a first LSB capacitor is assigned 1/2 sum(e), a second LSB capacitor is assigned 1/4 sum(e), a third LSB capacitor is assigned 1/8 sum(e), and a fourth LSB capacitor is assigned 1/16 sum(e).

10. The device of claim 6, in which the calibration DAC is formed by a plurality of less significant bit capacitors in at least a first one of the sub DAC segments.

\* \* \* \* \*